United States Patent
Seto

(10) Patent No.: US 7,126,355 B2
(45) Date of Patent: Oct. 24, 2006

(54) PHYSICAL QUANTITY SENSING DEVICE WITH BRIDGE CIRCUIT AND TEMPERATURE COMPENSATING METHOD

(75) Inventor: Kenji Seto, Shizuoka (JP)

(73) Assignee: Yamaha Hatsudoki Kabushiki Kaisha, Shizuoka-ken (JP)

(*) Notice: Subject to any disclaimer, the term of this patent is extended or adjusted under 35 U.S.C. 154(b) by 0 days.

(21) Appl. No.: 11/131,768

(22) Filed: May 18, 2005

(65) Prior Publication Data

US 2005/0285601 A1 Dec. 29, 2005

(30) Foreign Application Priority Data

May 31, 2004 (JP) .............................. 2004-161673

(51) Int. Cl.
*G01R 17/10* (2006.01)
*G01R 27/08* (2006.01)

(52) U.S. Cl. ..................... 324/725; 324/706; 324/526

(58) Field of Classification Search ................ 324/526, 324/725, 706

See application file for complete search history.

(56) References Cited

U.S. PATENT DOCUMENTS

| | | | | |
|---|---|---|---|---|
| 3,763,955 A * | 10/1973 | Schroder et al. | ............ | 180/168 |
| 3,913,392 A * | 10/1975 | Nagase et al. | ................. | 73/766 |
| 4,300,395 A * | 11/1981 | Shirouzu et al. | .............. | 73/708 |
| 5,307,690 A | 5/1994 | Hanazawa | | |
| 5,345,184 A * | 9/1994 | Andoh | ........................ | 324/720 |
| 5,656,938 A * | 8/1997 | Bennohr et al. | ............ | 324/706 |
| 6,329,825 B1 * | 12/2001 | Tanaka et al. | ............... | 324/725 |
| 6,559,661 B1 * | 5/2003 | Muchow et al. | ............ | 324/725 |
| 6,724,202 B1 * | 4/2004 | Tanizawa | .................... | 324/725 |
| 2002/0047460 A1 * | 4/2002 | Yoneda et al. | .............. | 310/216 |
| 2002/0154030 A1 * | 10/2002 | Diehl | .................... | 340/870.16 |

FOREIGN PATENT DOCUMENTS

| | | |
|---|---|---|
| JP | 05-060627 | 3/1993 |
| JP | 05-45537 | 6/1993 |
| JP | 07-002943 | 1/1995 |
| JP | 08-035891 | 2/1996 |
| JP | 10-261128 | 9/1998 |
| JP | 2001-050828 | 2/2001 |
| JP | 2001-356059 | 12/2001 |
| JP | 2003-227765 | 8/2003 |

OTHER PUBLICATIONS

Kenji Seto, "Physical Quantity Sensing Device with Bridge Circuit and Zero Point Adjusting Method," U.S. Appl. No. 11/130,954, filed on May 17, 2005.

* cited by examiner

*Primary Examiner*—Vincent Q. Nguyen
*Assistant Examiner*—John Zhu
(74) *Attorney, Agent, or Firm*—Keating & Bennett, LLP

(57) ABSTRACT

A physical quantity sensing device includes an AC voltage generator for generating an AC voltage and a bridge circuit that has first and second input points, to which the AC voltage is applied, and first and second output points connected to a differential amplifier. The bridge circuit includes first and second sensor elements, the impedance of which change with a physical quantity to be measured. The first and second sensor elements have a positive temperature characteristic in which sensitivity increases as temperature rises. The AC voltage generator includes an amplitude limiter which has a negative temperature characteristic that decreases the amplitude of the AC voltage with a rise in temperature, thereby compensating for temperature dependence of a differential voltage produced between the first and second output points.

16 Claims, 13 Drawing Sheets

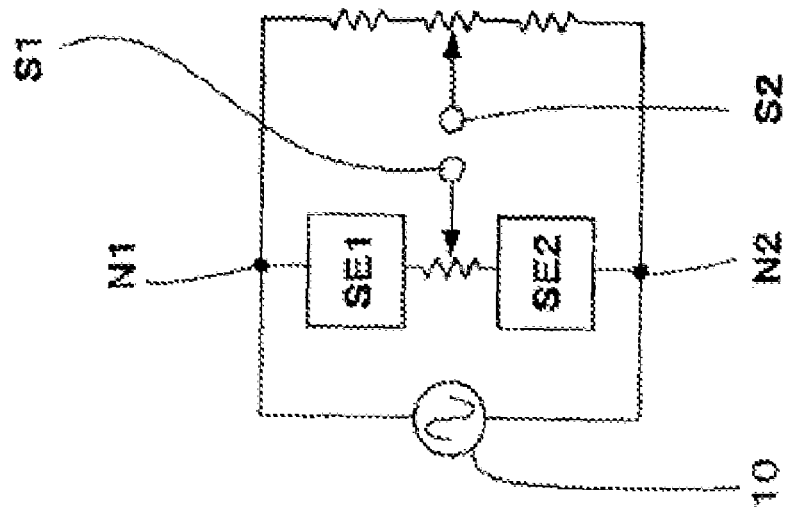
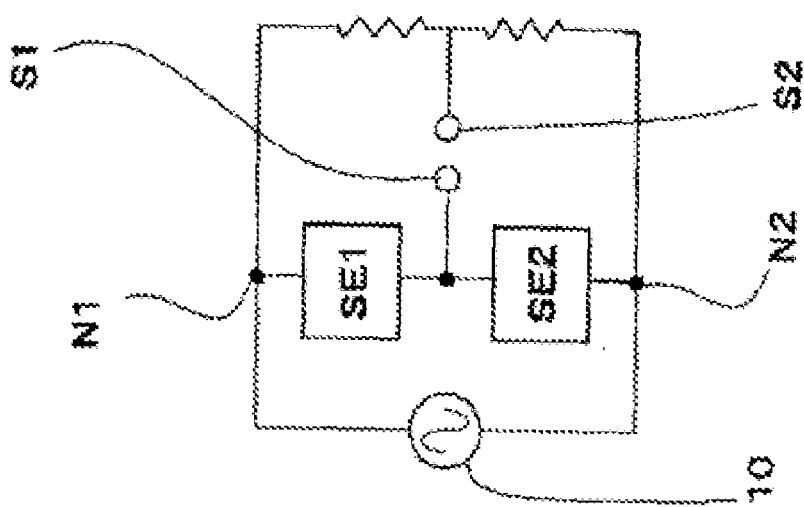
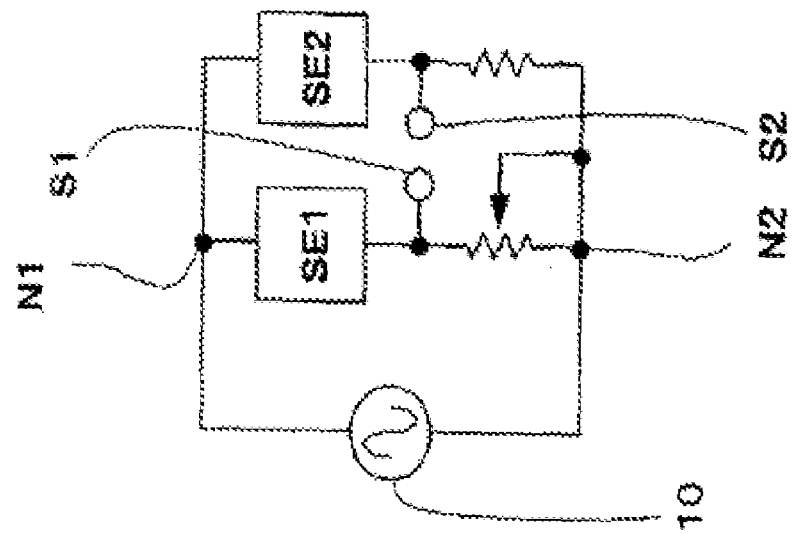

PHYSICAL QUANTITY SENSING DEVICE WITH BRIDGE CIRCUIT AND TEMPERATURE COMPENSATING METHOD

BACKGROUND OF THE INVENTION

1. Field of the Invention

The present invention relates to a physical quantity sensing device with a bridge circuit and more particularly relates to a sensing device that includes a pair of sensor elements, the impedance of which changes with a physical quantity to be measured. As used herein, the "physical quantity" is any quantity that can be measured with sensor elements, and refers to any of a broad variety of quantities such as forces (various forces including torque load), current, voltage, light quantity, and temperature.

2. Description of the Related Art

Magnetostrictive load sensing devices, including magnetostrictive sensor elements, have been developed for many years. A magnetostrictive sensor element is an element made of a magnetostrictive material, the initial permeability of which changes with the given load, and senses a variation in the initial permeability of the magnetostrictive material as a variation in the impedance (e.g., inductance and resistance) of a sensing coil, for example. Examples of preferred magnetostrictive materials include magnetic materials, soft magnetic materials and ultramagnetic materials such as ferrous alloys, iron-chromium based alloys, iron-nickel based alloys, iron-cobalt based alloys, pure iron, iron-silicon based alloys, iron-aluminum based alloys, and permalloys.

FIG. 1A is an equivalent circuit diagram showing a typical sensing circuit in a conventional magnetostrictive load sensing device. The bridge circuit shown in FIG. 1A has first and second input points N1 and N2, to which an AC voltage is supplied, and first and second output points S1 and S2, which are connected to a differential amplifier (not shown). The AC voltage is supplied to the first and second input points N1 and N2 from an AC voltage generator 10.

In the bridge circuit shown in FIG. 1A, magnetostrictive sensor elements SE1 and SE2 are connected in parallel to each other. A bridge circuit of this type will be referred to herein as a "parallel bridge circuit". Load sensing devices with such a parallel bridge circuit are described in Japanese Patent Application Laid-Open Publications Nos. 5-60627, 10-261128 and 2001-356059 and Japanese Utility Model Application Laid-Open Publication No. 5-45537, for example.

The sensitivity of a magnetostrictive sensor element changes due to a temperature variation and therefore requires some temperature compensation. In the prior art, such temperature compensation is performed via a temperature sensor and a sensitivity variation corrector including thermistors (see Japanese Patent Application Laid-Open Publication No. 2001-356059, for example).

Japanese Patent Publication No. 2776693 discloses a method of performing temperature compensation on the sensing characteristic of a sensing device by measuring the DC resistance of an AC signal detecting coil. This method is advantageous because no special temperature sensing elements are needed anymore and because the temperature of a coil with a temperature coefficient can be measured directly.

However, according to the method disclosed in Japanese Patent Application Laid-Open Publication No. 2001-356059, not only the thermistors as temperature sensing elements but also the temperature sensor and sensitivity corrector are needed, thus requiring an overly complicated circuit configuration. Then, the circuit board including those circuits and elements should have an increased area and the manufacturing cost would increase significantly, too.

Likewise, the method disclosed in Japanese Patent Publication No. 2776693 needs a means for measuring the DC resistance separately, thus requiring a more complicated circuit configuration, a bigger circuit board and a higher manufacturing cost also.

SUMMARY OF THE INVENTION

In order to overcome the problems described above, preferred embodiments of the present invention provide a physical quantity sensing device that can perform temperature compensation on the amplification factor with a simple circuit configuration including no special temperature sensing elements or gain controllers.

A physical quantity sensing device according to a preferred embodiment of the present invention preferably includes an AC voltage generator for generating an AC voltage and a bridge circuit that has first and second input points, to which the AC voltage is applied, and first and second output points, which are connected to a differential amplifier. The bridge circuit preferably includes a first sensor element, the impedance of which changes with a physical quantity to be measured, and a second sensor element, the impedance of which also changes with the physical quantity to be measured. The first and second sensor elements preferably have a positive temperature characteristic, the sensitivity of which increases as the temperature rises. The AC voltage generator preferably includes an oscillator and an amplitude limiter for supplying the AC voltage, the amplitude of which is limited within a predetermined range, in response to an output signal of the oscillator. The amplitude limiter preferably has a negative temperature characteristic that decreases the amplitude of the AC voltage with a rise in temperature, thereby compensating for temperature dependence of a differential voltage produced between the first and second output points.

In one preferred embodiment of the present invention, the oscillator is preferably a sine wave oscillator, which has first and second operational amplifiers and in which the output of the first operational amplifier is supplied to an inverting input terminal of the second operational amplifier; The amplitude limiter preferably includes a terminal that receives an output signal of the second operational amplifier, resistors R1 and R2, which are connected in series together so as to connect the terminal to a Vcc potential, resistors R3 and R4, which are connected in series together so as to connect the terminal to a ground potential, a forward diode D1 and a resistor R5, which are connected in series together so as to connect a connection point between the resistors R1 and R2 to the ground potential, a diode D2, which connects a connection point between the diode D1 and the resistor R5 to the inverting input terminal of the second operational amplifier, a forward diode D3 and a resistor R6, which are connected in series together so as to connect a connection point between the resistors R3 and R4 to the Vcc potential, and a diode D4, which connects a connection point between the diode D3 and the resistor R6 to the inverting input terminal of the second operational amplifier. As the potential at the terminal increases or decreases, the diodes D2 and D4 are preferably alternately turned ON, thereby limiting the amplitude of the potential at the terminal.

In this particular preferred embodiment, the diodes D1 and D2 are preferably the same type of diodes of which the cathodes are connected together, and the diodes D3 and D4 are preferably the same type of diodes of which the anodes are connected together. Current is preferably always flowing through the diodes D1 and D3 during their operations.

In a specific preferred embodiment, resistance values of the resistors R5 and R6 are preferably adjusted such that a variation in the amplitude of the differential voltage, generated between the first and second output points of the bridge circuit, with temperature becomes about 0.1%/° C. or less in the range of about 0° C. to about 80° C.

In another preferred embodiment, the bridge circuit preferably includes a first bridge arm for electrically connecting the first input point to the first output point, a second bridge arm for electrically connecting the first output point to the second input point, a third bridge arm for electrically connecting the first input point to the second output point, and a fourth bridge arm for electrically connecting the second output point to the second input point. The first bridge arm preferably includes the first sensor element and the second bridge arm preferably includes the second sensor element. The total impedance of the first and second bridge arms is preferably smaller than that of the third and fourth bridge arms.

In still another preferred embodiment, each of the first and second sensor elements is preferably a magnetostrictive sensor element, the impedance of which changes according to a given load, and the physical quantity to be measured is preferably a load that has been placed on one of the first and second sensor elements.

In this particular preferred embodiment, the first sensor element is preferably a first magnetostrictive sensor element including a first magnetostrictive member made of a magnetostrictive material and a first coil surrounding the first magnetostrictive member. The first coil preferably electrically connects the first input point and the first output point together. The second sensor element is preferably a second magnetostrictive sensor element including a second magnetostrictive member made of the magnetostrictive material and a second coil surrounding the second magnetostrictive member. The second coil preferably electrically connects the first output point and the second input point together.

In yet another preferred embodiment, at least one of the first and second bridge arms preferably includes a balancing variable resistor.

In yet another preferred embodiment, the bridge circuit preferably further includes a balancing variable resistor, which is connected in series between the first and second sensor elements, and the first output point is preferably connected to the balancing variable resistor.

In a specific preferred embodiment, the bridge circuit preferably further includes a second balancing variable resistor, which is connected in series between the third and fourth bridge arms, and the second output point is preferably connected to the second balancing variable resistor.

More particularly, while the sensing device is performing a measuring operation, preferably substantially no current flows between the first output point and the differential amplifier and between the second output point and the differential amplifier.

In yet another preferred embodiment, the AC voltage generator, the bridge circuit and the differential amplifier are preferably integrated together on the same electronic circuit board.

A vehicle according to a preferred embodiment of the present invention preferably includes the physical quantity sensing device according to any of the preferred embodiments of the present invention described above, and an engine operatively coupled to the physical quantity sensing device such that an operation of the engine is controlled according to the physical quantity sensed by the physical quantity sensing device.

In one preferred embodiment of the present invention, the physical quantity sensed by the physical quantity sensing device is preferably a quantity depending on a force that has been applied by an operator on handlebars of the vehicle.

A physical quantity sensing device according to any of various preferred embodiments of the present invention described above can perform temperature compensation on its sensitivity with a simple circuit configuration including no special temperature sensing elements or gain controllers.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 1A shows a bridge circuit having two sensor elements that are connected together in parallel.

FIG. 1B shows a bridge circuit having two sensor elements that are connected together in series.

FIG. 1C shows a bridge circuit in which two sensor elements are connected together in series and in which variable resistors are provided for two output points thereof.

DETAILED DESCRIPTION OF PREFERRED EMBODIMENTS

FIGS. 1A, 1B and 1C are circuit diagrams showing physical quantity sensing devices, to each of which preferred embodiments of the present invention are applicable.

Each of the bridge circuits shown in FIGS. 1A through 1C preferably has first and second input points N1 and N2, to which an AC voltage is applied, and first and second output points S1 and S2, which are connected to a differential amplifier (not shown). The AC voltage is preferably applied to the first and second input points N1 and N2 from an AC voltage generator 10.

In a load sensing device including magnetostrictive sensors as the sensor elements SE1 and SE2, the sensitivity of the magnetostrictive sensor elements SE1 and SE2 has a "positive" temperature coefficient. Accordingly, even if the AC voltage applied to the first and second input points N1 and N2 has constant amplitude, the amplitude of the differential voltage produced between the first and second output points S1 and S2 increases as the temperature rises.

According to a preferred embodiment of the present invention, however, to compensate for such a temperature characteristic, a circuit configuration in which the amplitude of the AC voltage, applied to the bridge circuit, decreases automatically with a rise in temperature is adopted. More specifically, a circuit with a "negative" temperature coefficient is adopted as the amplitude limiter (not shown in FIG. 1) in the AC voltage generator 10 and its temperature coefficient is controlled, thereby preventing the amplitude of the differential voltage, produced between the first and second output points S1 and S2, from varying with the temperature.

Preferred Embodiment 1

Hereinafter, a magnetostrictive load sensing device will be described as a physical quantity sensing device according to a specific preferred embodiment of the present invention.

Figure 2:
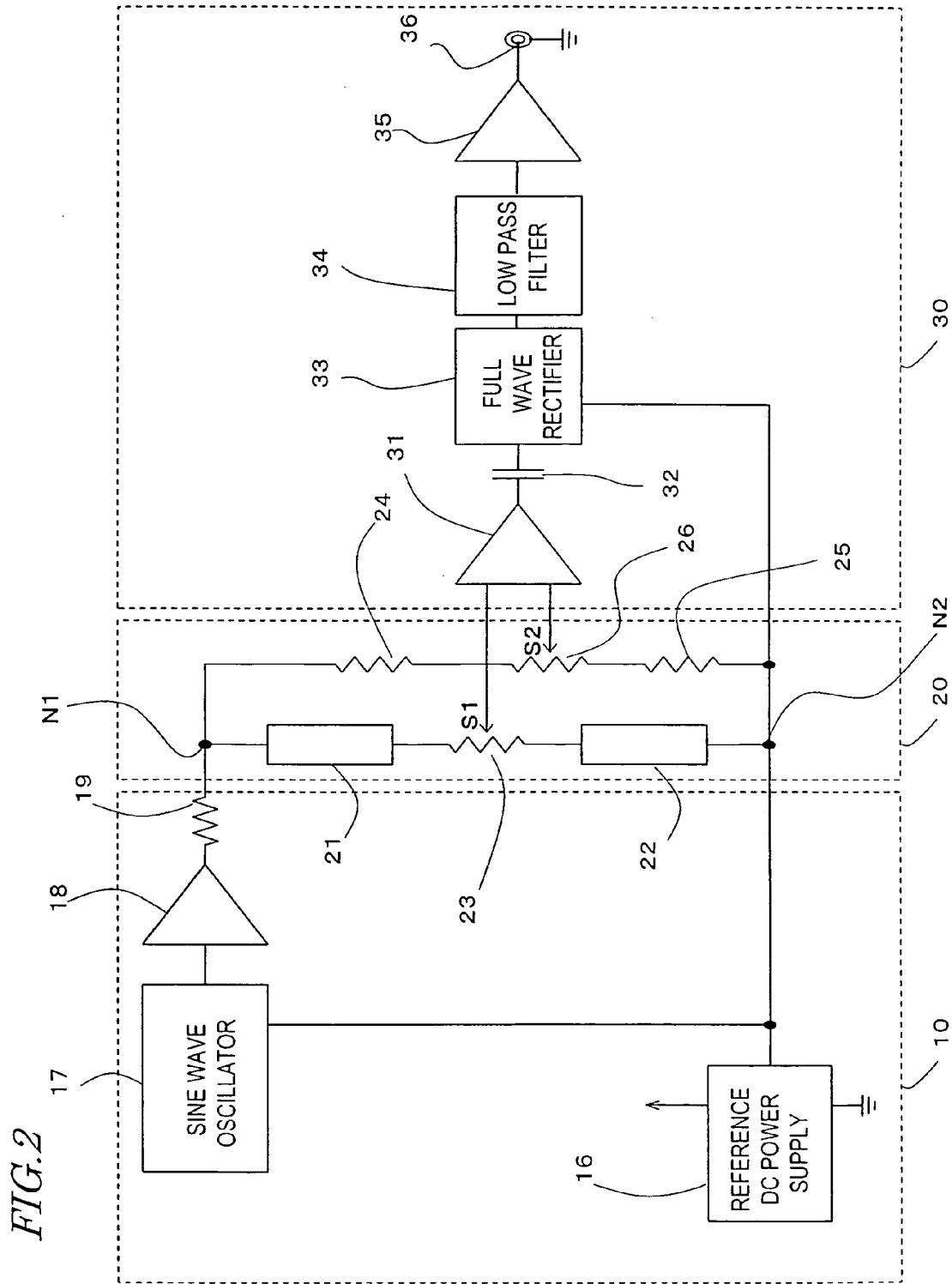
FIG. 2 is a circuit diagram showing a circuit configuration for a physical quantity sensing device according to a first specific preferred embodiment of the present invention.

FIG. 2 shows a circuit configuration for the main circuit sections of a load sensing device according to this preferred embodiment. This load sensing device preferably includes an AC voltage generating section 10, a bridge circuit section 20 and a sensing circuit section 30.

The AC voltage generating section 10 preferably includes a reference DC power supply 16, a sine wave oscillator 17 for producing a sine wave that oscillates with respect to a reference voltage, a buffer amplifier 18 with a high input impedance, and a current limiting fixed resistor 19 for adjusting the amount of current (i.e., exciting current) to be supplied to the bridge circuit section 20.

The bridge circuit section 20 preferably includes two magnetostrictive sensor elements 21 and 22, which are connected in series together with a balancing variable resistor 23 interposed between them, and two bridge fixed resistors 24 and 25, which are also connected in series together with a balancing variable resistor 26 interposed between them. This bridge circuit section 20 preferably has basically the same configuration as the bridge circuit shown in FIG. 1C.

The sensing circuit section 30 preferably has an AC differential amplifier 31 for amplifying the differential voltage of the bridge circuit section 20, a DC blocking capacitor 32 for removing the DC components from the output signal of the differential amplifier 31, a full wave rectifier 33 for rectifying the remaining AC signal that has passed through the capacitor 32, a low pass filter 34 for smoothing the output voltage of the full wave rectifier 33, a DC amplifier 35 with a gain controlling variable resistor, and a signal voltage output terminal 36.

Figure 3:
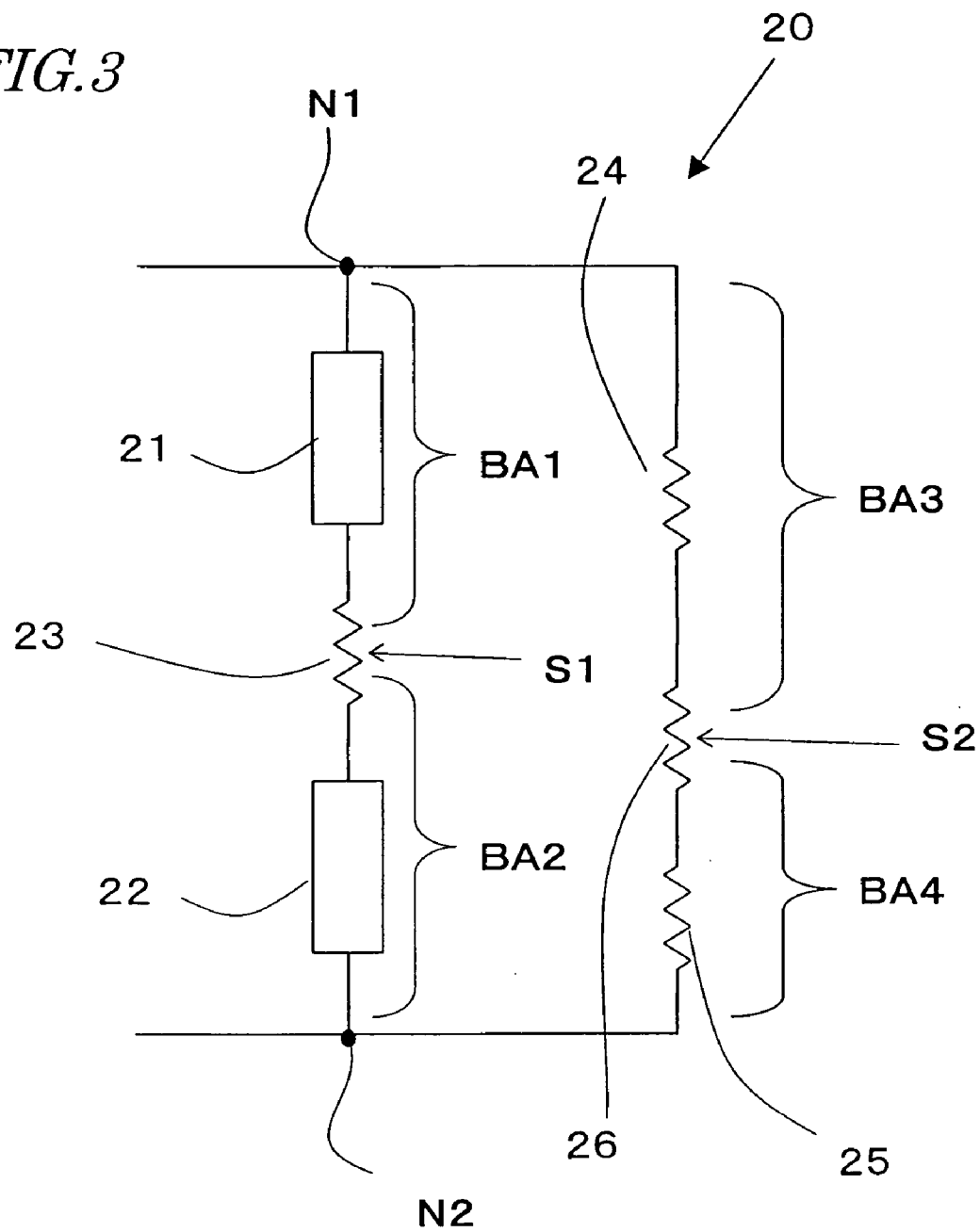
FIG. 3 is a circuit diagram showing a detailed configuration for the bridge circuit section 20 shown in FIG. 2.

Next, the configuration of the bridge circuit section 20 will be described in further detail with reference to FIG. 3.

The bridge circuit section 20 of this preferred embodiment preferably has first and second input points N1 and N2, to which an AC voltage (or alternating current) is applied, and first and second output points S1 and S2, which are connected to the sensing circuit section 30. The AC voltage is preferably applied to the first and second input points N1 and N2 from an AC voltage generator 10.

This bridge circuit section 20 preferably includes a first bridge arm BA1 for electrically connecting the first input point N1 to the first output point S1, a second bridge arm BA2 for electrically connecting the first output point S1 to the second input point N2, a third bridge arm BA3 for electrically connecting the first input point N1 to the second output point S2, and a fourth bridge arm BA4 for electrically connecting the second output point S2 to the second input point N2.

The first bridge arm BA1 preferably includes a first magnetostrictive sensor element 21, the impedance of which changes with a physical quantity (i.e., the load) to be measured, and the second bridge arm BA2 preferably includes a second magnetostrictive sensor element 22, the impedance of which also changes with the load. In the bridge circuit shown in FIG. 3, the two sensor elements SE1 and SE2 are connected in series together in this manner. That is why such a bridge circuit may be called a "serial bridge circuit" as opposed to the conventional "parallel bridge circuit".

Each of the magnetostrictive sensor elements 21 and 22 preferably includes a magnetostrictive member made of a magnetostrictive material and a coil surrounding the magnetostrictive member. The coil of the magnetostrictive sensor element 21 preferably electrically connects the first input point N1 and the first output point S1 together. On the other hand, the coil of the magnetostrictive sensor element 22 preferably electrically connects the first output point S1 and the second input point N2 together.

Figure 4A:
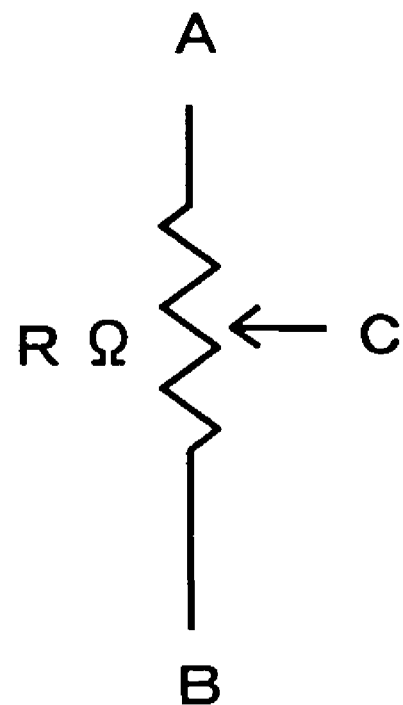
FIG. 4A shows a variable resistor.
Figure 4B:
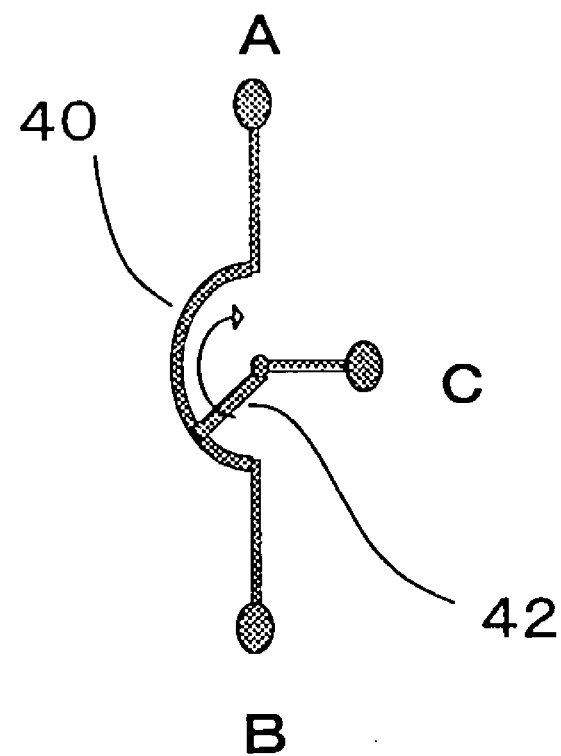
FIG. 4B shows a specific configuration for the variable resistor shown in FIG. 4A.

In the bridge circuit section 20 of this preferred embodiment, the connection node (i.e., the first output point S1) between the first and second bridge arms BA1 and BA2 is present in the balancing variable resistor 23. The balancing variable resistor 23 for use in this preferred embodiment preferably has a configuration as shown in FIGS. 4A and 4B. A resistive element 40 provided between terminals A and B preferably has a fixed resistance value R. However, by shifting the connection point (or contact point) between a contact 42 connected to a terminal C and the resistive element 40, the value of the resistance between the terminals A and C can be varied. Specifically, if the value of the resistance between the terminals A and C is increased, then that of the resistance between the terminals B and C decreases. At the location of the connection point between the contact 42 and the resistive element 40, the resistive element 40 can be divided into two resistive portions that are connected in series together. Supposing those two resistive portions have resistance values Ra and Rb, R=Ra+Rb is satisfied.

Referring back to FIG. 3, the impedance of the first bridge arm BA1 is represented as the sum of the impedance of the magnetostrictive sensor element 21 and the resistance Ra of one resistive portion in the balancing variable resistor 23 (if the wiring resistance is neglected; the same statement will apply to the following description, too). On the other hand, the impedance of the second bridge arm BA2 is represented as the sum of the impedance of the magnetostrictive sensor element 22 and the resistance Rb of the other resistive portion in the balancing variable resistor 23. Accordingly, the overall impedance of the first and second bridge arms BA1 and BA2 is represented as the sum of the total impedance of the magnetostrictive sensor elements 21 and 22 and the resistance value R of the balancing variable resistor 23. The resistance value R may be approximately equal to the difference in impedance between the magnetostrictive sensor elements 21 and 22, and can be sufficiently smaller than the impedance of the magnetostrictive sensor element 21 or 22. The impedances of the magnetostrictive sensor elements 21 and 22 for use in this preferred embodiment preferably fall within the range of about 50 Ω to about 100 Ω, for example. Meanwhile, the difference in impedance between these two magnetostrictive sensor elements 21 and 22 may be about 5 Ω to about 10 Ω, for example. Thus, the resistance value R may also be about 5 Ω to about 10 Ω, for example.

On the other hand, the third bridge arm BA3 in the bridge circuit section 20 preferably includes a fixed resistor 24 and the fourth bridge arm BA4 preferably includes a fixed resistor 25. And the connection node (i.e., the second output point S2) between the third and fourth bridge arms BA3 and BA4 is present in a balancing variable resistor 26. The structure of the balancing variable resistor 26 is preferably the same as that of the balancing variable resistor 23.

In this preferred embodiment, the terminal C (see FIGS. 4A and 4B) in the balancing variable resistors 23 and 26 is preferably connected to the sensing circuit section 30 shown in FIG. 2 as described above. Accordingly, if the input impedance of the AC differential amplifier 31 is high, then a configuration in which no current flows between the output points of the bridge circuit section 20 and the signal input section of the sensing circuit section 30 is realized. The effects achieved by such a configuration will be described later.

Hereinafter, the configuration of the sine wave oscillator 17 in the AC voltage generating section 10 will be described with reference to FIGS. 5 through 9.

Figure 5:
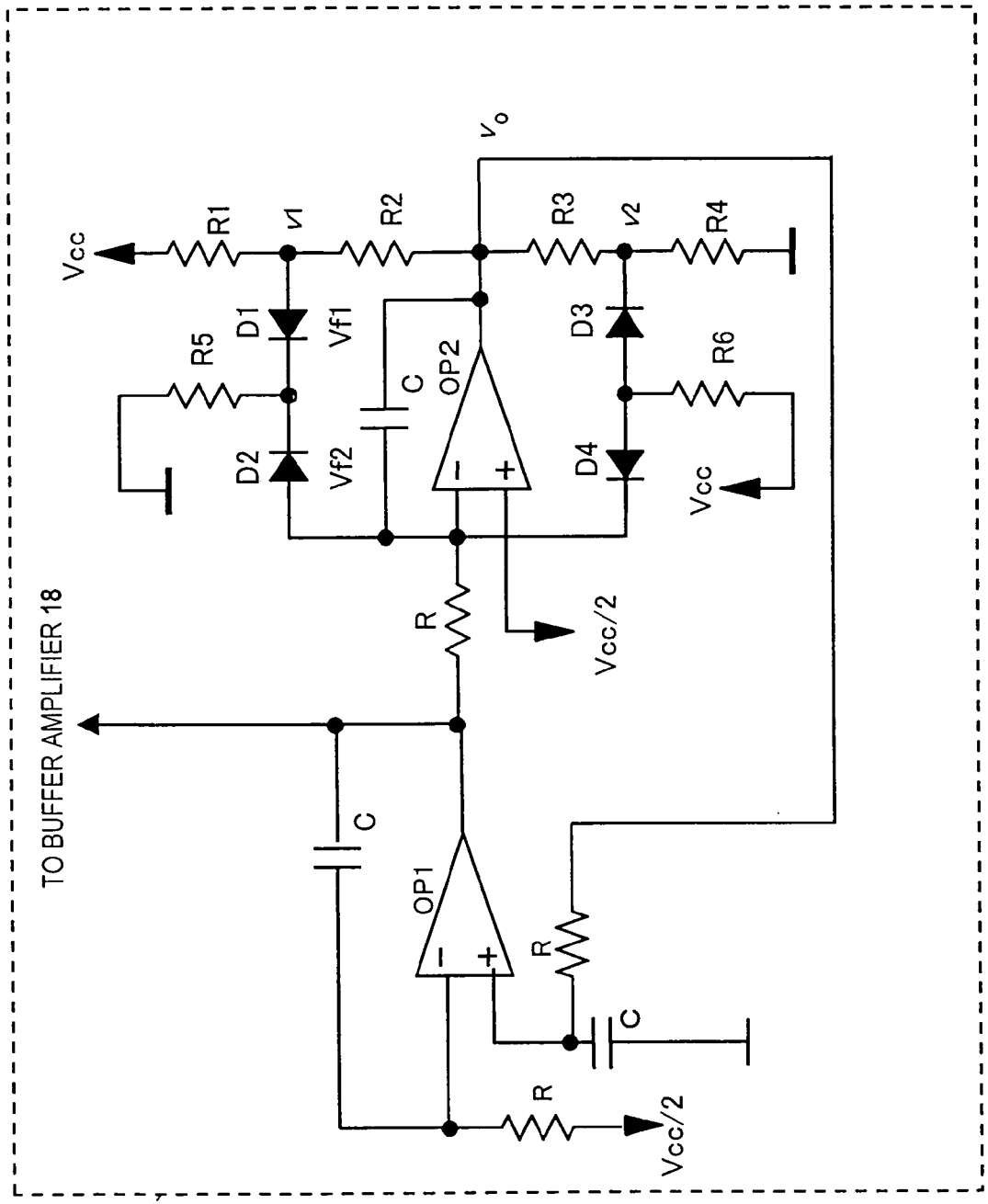
FIG. 5 is a circuit diagram showing the sine wave oscillator 17 of the first specific preferred embodiment of the present invention.

First, referring to FIG. 5, the circuit configuration of the sine wave oscillator 17 of this preferred embodiment is shown. This sine wave oscillator 17 preferably includes the oscillator shown in FIG. 6 and an amplitude limiter for limiting the amplitude of the output sine wave of the oscillator within a predetermined range.

Figure 6:
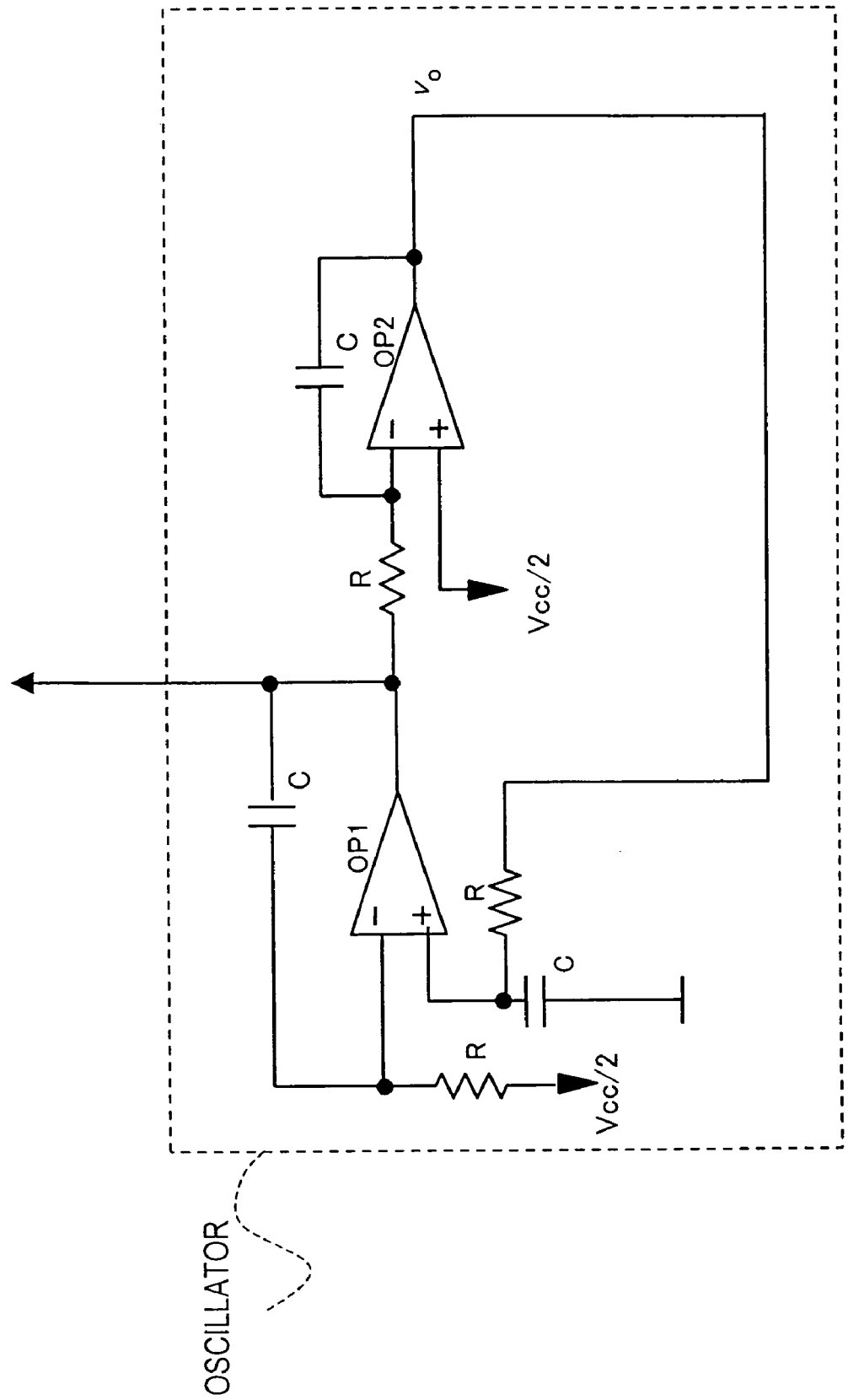
FIG. 6 is a circuit diagram showing the oscillator of the sine wave oscillator 17.

The oscillator preferably has a circuit configuration in which two operational amplifiers OP1 and OP2 are connected together as shown in FIG. 6, and preferably functions as a quadrature sine wave oscillator. The output signal Vo of the second operational amplifier OP2 is preferably supplied to the non-inverting input terminal of the first operational amplifier OP1 by way of a resistor R. On the other hand, the output signal Vo' of the first operational amplifier OP1 is preferably supplied not only to the buffer amplifier 18 shown in FIG. 2 but also to the inverting input terminal of the second operational amplifier OP2 by way of another resistor R. These signals Vo and Vo' preferably have sine waveforms, the amplitudes of which are equal to each other but the phases of which are shifted from each other.

In this preferred embodiment, an amplitude limiter, including the four diodes D1 through D4 shown in FIG. 5, is preferably additionally provided for this oscillator. Hereinafter, the configuration and operation of the amplitude limiter will be described with reference to FIGS. 7A and 7B.

Figure 7A:
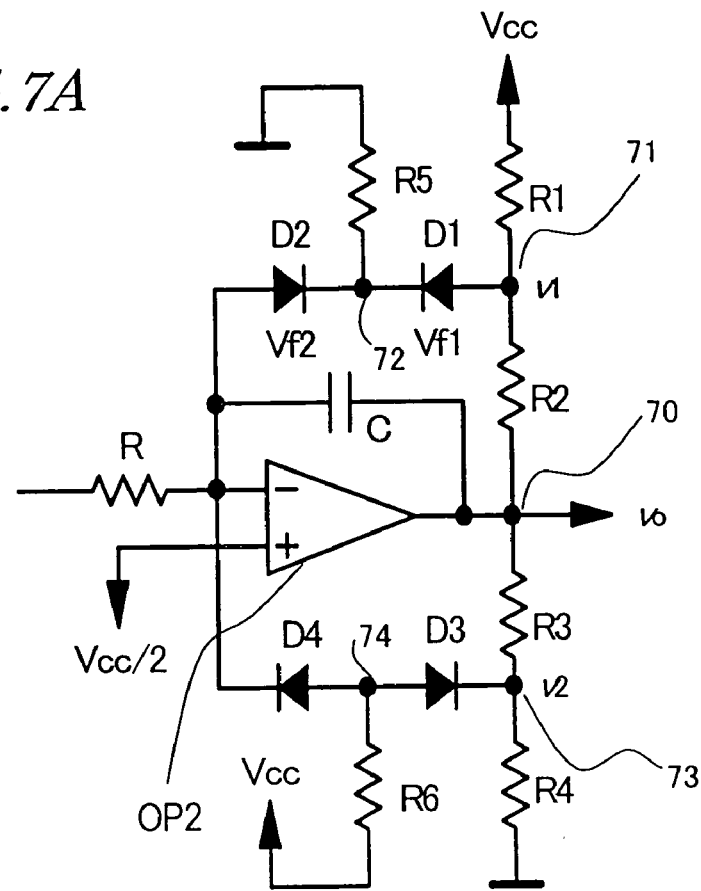
FIG. 7A is a circuit diagram showing the second operational amplifier and amplitude limiter of the sine wave oscillator 17.
Figure 7B:
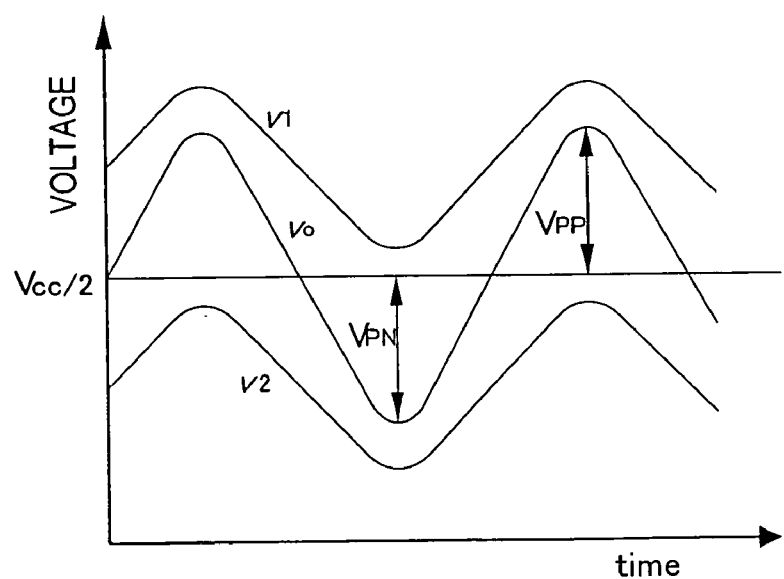
FIG. 7B shows the waveforms of voltages V1, V2 and Vo.

FIG. 7A is a circuit diagram showing the second operational amplifier OP2 and the amplitude limiter, and FIG. 7B shows the waveforms of voltages $V_1$, $V_2$ and Vo.

The amplitude limiter shown in FIG. 7A preferably includes a terminal 70 that receives the output signal of the second operational amplifier OP2, a pair of resistors R1 and R2 that is connected in series together to connect the terminal 70 to Vcc potential, and another pair of resistors R3 and R4 that is connected in series together to connect the terminal 70 to ground potential. This circuit preferably further includes a forward diode D1 and a resistor R5 that are connected in series together to connect the connection point 71 between the resistors R1 and R2 to ground potential, a diode D2 for connecting the connection point 72 between the forward diode D1 and the resistor R5 to the inverting input terminal of the operational amplifier OP2, a forward diode D3 and a resistor R6 that are connected in series together to connect the connection point 73 between the resistors R3 and R4 to Vcc potential, and a diode D4 for connecting the connection point 74 between the forward diode D3 and the resistor R6 to the inverting input terminal of the operational amplifier OP2.

As will be described later, as the voltage Vo increases and decreases at the terminal 70, the diodes D2 and D4 are preferably turned ON alternately, thereby limiting the amplitude of the voltage variation at the terminal 70. Also, the diodes D1 and D2 are preferably the same type of diodes of which the cathodes are connected together, while the diodes D3 and D4 are preferably the same type of diodes of which the anodes are connected together. During the operation, current is always flowing through the diodes D1 and D3.

In this circuit, the diode D1 is inserted to compensate for the forward voltage of the diode D2, while the diode D3 is inserted to compensate for the forward voltage of the diode D4. Also, the resistors R5 and R6 are preferably fixed resistors for adjusting the temperature coefficient of the oscillation amplitude.

The voltage V1 at the connection point 71 preferably controls a negative peak voltage $V_{PN}$, while the voltage V2 at the connection point 73 preferably controls a positive peak voltage $V_{PP}$. As can be seen from FIG. 7B, the amplitude of the voltage Vo is preferably limited to the range defined by the negative and positive peak voltages $V_{PN}$ and $V_{PP}$.

Thus, the component constants of the circuit shown in FIG. 7A is preferably defined so as to satisfy the following Equation (1):

$$R_5 \rangle\rangle \frac{R_1 \cdot R_2}{R_1 + R_2}, \quad R_6 \rangle\rangle \frac{R_3 \cdot R_4}{R_3 + R_4} \quad (1)$$

where $R_1$ through $R_6$ represent the resistance values of the resistors R1 through R6, respectively.

In this case, the positive and negative peak voltages $V_{PP}$ and $V_{PN}$ are given by the following Equations (2) and (3), respectively:

$$V_{PP} = (R_3/R_4) \cdot Vcc/2 - (1 + R_3/R_4) \cdot (V_{f3} - V_{f4}) \quad (2)$$

$$V_{PN} = (R_2/R_1) \cdot Vcc/2 - (1 + R_2/R_1) \cdot (V_{f1} - V_{f2}) \quad (3)$$

where $V_{f1}$, $V_{f2}$, $V_{f3}$ and $V_{f4}$ represent the forward voltages of the diodes D1, D2, D3 and D4, respectively.

In the oscillator, when a sine wave (i.e., the signal Vo') is supplied from the first operational amplifier OP1 to the second operational amplifier OP2 by way of the resistor R, the voltage between the terminals of the capacitor C shown in FIG. 7A changes. In this case, the second operational amplifier OP2 automatically adjusts the magnitude of the output voltage Vo such that the voltage at the inverting input terminal thereof becomes equal to that at the non-inverting input terminal thereof. The voltage Vo is a sine wave just like the voltage applied to the inverting input terminal of the second operational amplifier OP2. However, there is a phase shift between these two sine waves.

In this preferred embodiment, the voltage at the non-inverting input terminal of the second operational amplifier OP2 is Vcc/2. Accordingly, the second operational amplifier OP2 preferably adjusts the magnitude of its output voltage Vo so as to equalize the voltage at the inverting input terminal with Vcc/2. As a result, either the voltage V1 that has been divided by the resistors R1 and R2 or the voltage V2 that has been divided by the resistors R3 and R4 becomes closer to Vcc/2. Then, one of the diodes D2 and D4 is turned ON, thus reversing the direction of current flowing through the capacitor C shown in FIG. 7A and changing the voltage between the two terminals of the capacitor C, which has some effect on the voltage Vo again. Consequently, the oscillation amplitude of the voltage Vo and eventually the amplitude of the AC voltage applied to the bridge circuit section are limited.

Figure 8:
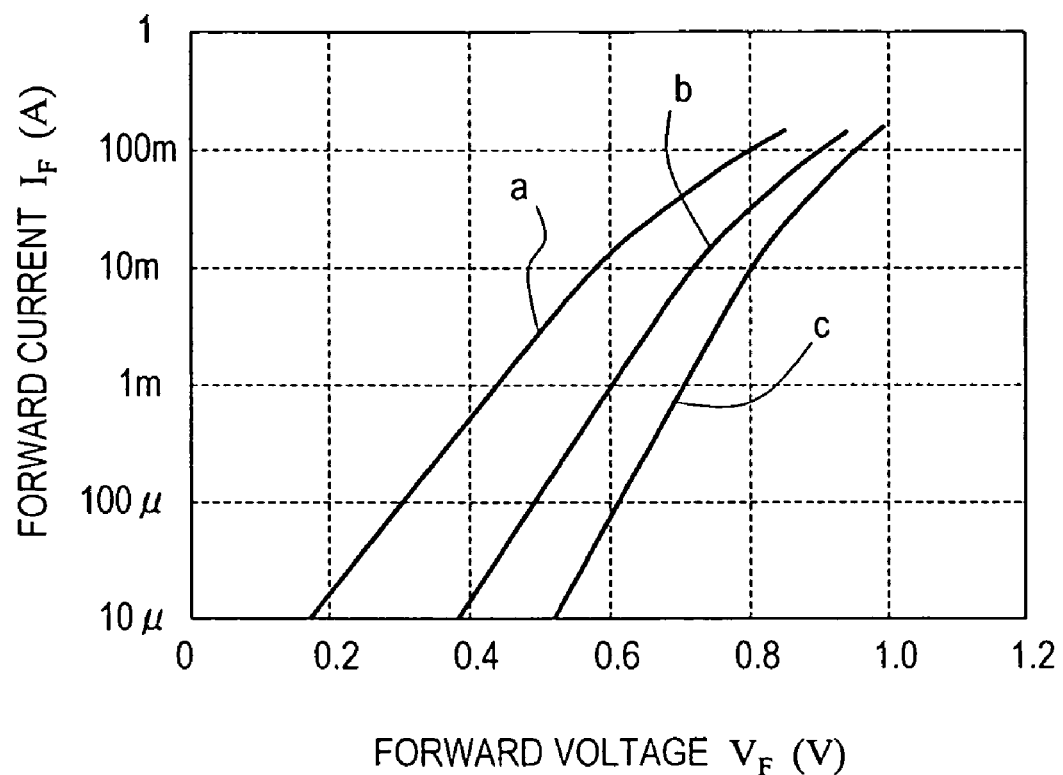
FIG. 8 is a graph showing relationships between the forward voltage $V_F$ and the forward current $I_F$ in a normal diode.

FIG. 8 is a graph showing relationships between the forward voltage $V_F$ and the forward current $I_F$ in a normal diode. In FIG. 8, the curve a represents the forward current-voltage characteristic when the diode is operated at about 100° C., the curve b represents the forward current-voltage characteristic when the diode is operated at about 25° C., and the curve c represents the forward current-voltage characteristic when the diode is operated at about −25° C.

As is clear from FIG. 8, even if the forward current $I_F$ is constant, the forward voltage $V_F$ decreases as the temperature increases. Also, the smaller the forward current $I_F$, the more significantly $V_F$ changes with the temperature.

The diodes D1 and D3 are always ON, no matter what the operational amplifier is doing. The resistance values of the resistors R5 and R6 are defined such that the amount of forward current flowing through the diodes D1 and D3 is greater than that of current flowing through the diodes D2 and D4. As a result, the forward voltage $V_{f1}$ of the diode D1 is less affected by the same temperature variation than the forward voltage $V_{f2}$ of the diode D2 is. In the same way, the forward voltage $V_{f3}$ of the diode D3 is less affected by the same temperature variation than the forward voltage $V_{f4}$ of the diode D4 is.

As $(V_{f3}-V_{f4})$ and $(V_{f1}-V_{f2})$ change with the temperature, the positive and negative peak voltages $V_{PP}$ and $V_{PN}$ also vary as represented by Equation (2) and (3). The higher the temperature, the smaller the magnitude of this variation, which means that the amplitude of the output signal Vo has a "negative" temperature coefficient.

It should be noted that as the difference between the amount of forward current flowing through the diode D1 or D3 and that of forward current flowing through the diode D2 or D4 widens, the temperature coefficient increases. If the resistance value of the resistor R5 is changed, then the ratio of currents flowing through the diodes D1 and D2 can be adjusted. Likewise, if the resistance value of the resistor R6 is changed, then the ratio of currents flowing through the diodes D3 and D4 can be adjusted, too. Accordingly, by appropriately adjusting the resistance values of the resistors R5 and R6, the negative temperature coefficient of the amplitude of the output signal Vo can be controlled to a desired value.

In this preferred embodiment, by taking advantage of this phenomenon, the negative temperature coefficient of the oscillation amplitude and the positive temperature coefficient of the magnetostrictive sensor elements are preferably set substantially equal to each other, thereby canceling the respective temperature characteristics (i.e., making the sum of the positive and negative temperature coefficients approximately equal to zero). As a result, temperature compensation on the load sensed can be made automatically without additionally providing any special temperature sensing elements or gain controllers.

Figure 9A:
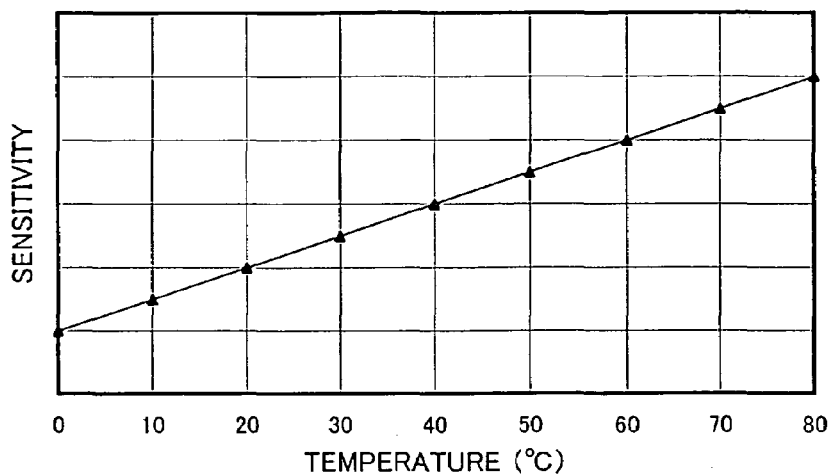
FIGS. 9A, 9B and 9C are graphs schematically showing the temperature characteristics of the sensor sensitivity, oscillation voltage and differential voltage, respectively, in the first specific preferred embodiment, where the abscissas represent the temperature and the ordinates represent relative values.
Figure 9B:
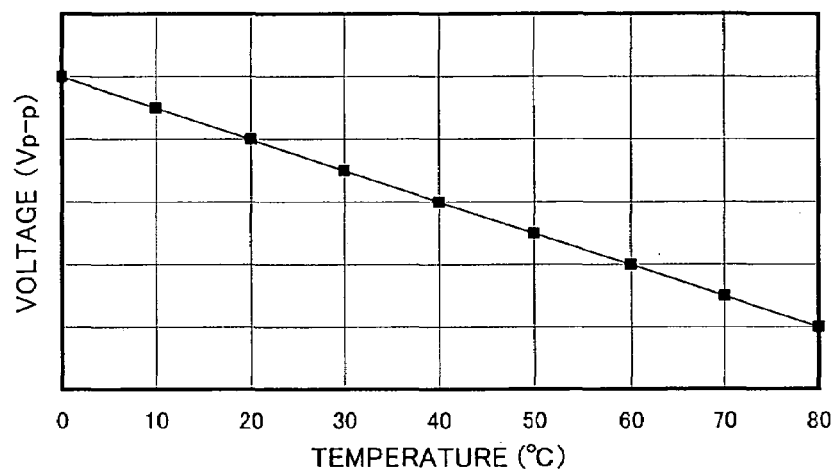
Figure 9C:
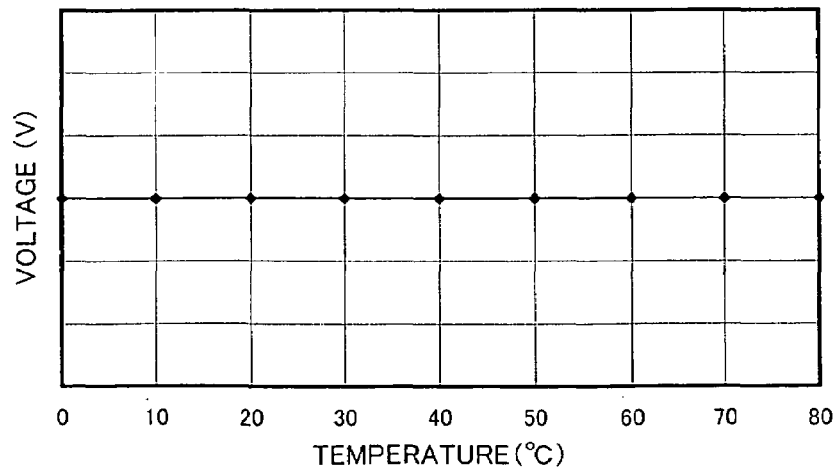

FIGS. 9A, 9B and 9C are graphs schematically showing the temperature characteristics of the sensitivity of the sensor, oscillation voltage and differential voltage, respectively, in this preferred embodiment.

As shown in FIG. 9A, the sensitivity increases as the temperature increases. Conversely, the amplitude of the AC voltage (sine wave signal) applied from the AC voltage generating section 10 to the bridge circuit by way of the buffer amplifier 18 decreases as the temperature increases.

In this preferred embodiment, by appropriately controlling the resistance values of the resistors R5 and R6 in the amplitude limiter, the absolute value of the variation rate of the amplitude of the AC signal (i.e., exciting current) to the temperature (i.e., the gradient of the graph shown in FIG. 9B) is preferably substantially equal to that of the variation rate of the sensor sensitivity to the temperature (i.e., the gradient of the graph shown in FIG. 9A).

As a result, the positive and negative temperature dependences (or temperature characteristics) cancel each other, thereby obtaining a differential voltage with almost no temperature dependence (i.e., output voltage after temperature compensation) as shown in FIG. 9C.

Magnetostrictive Sensor Elements

Next, an exemplary arrangement of the magnetostrictive sensor elements 21 and 22 for use in a load sensing device according to this preferred embodiment will be described with reference to FIGS. 10 and 11. The load sensing device of this preferred embodiment may be used in various types of machines that need to measure the load placed thereon. In the following example, the load sensing device is attached to the steering shaft of a vehicle to detect torque.

Figure 10:
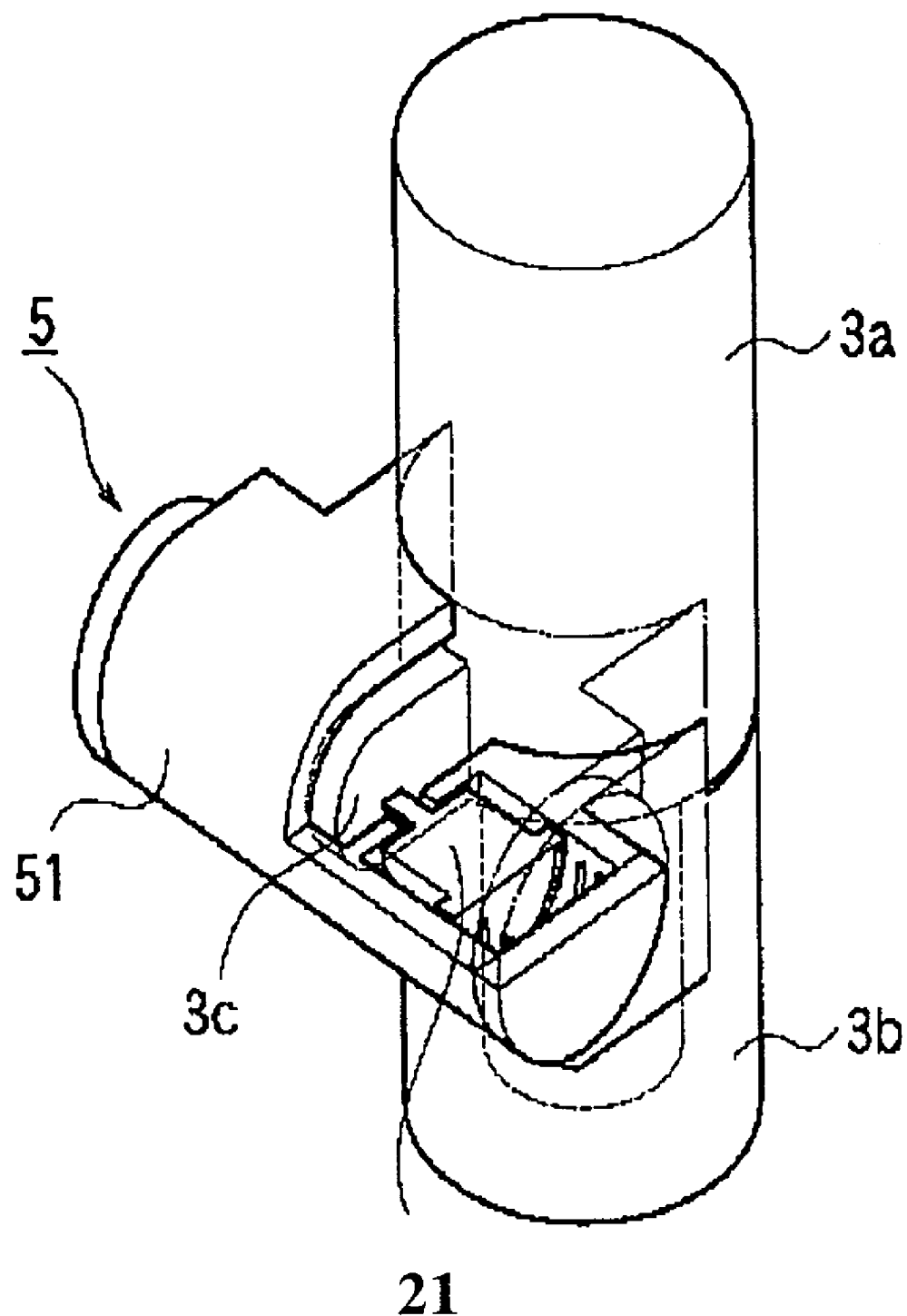
FIG. 10 is a perspective view illustrating a load sensor unit attached to a steering shaft.

FIG. 10 is a perspective view illustrating a load sensor unit 5 attached to a steering shaft. FIG. 11 is a cross-sectional view of the load sensor unit 5 as viewed on a plane that intersects the steering shaft at right angles. The load sensor unit 5 shown in FIG. 10 is preferably provided where an upper steering shaft 3a and a lower steering shaft 3b are joined together. The lower steering shaft 3b preferably has a sensor storage portion 51 at the upper end thereof, where the lower and upper steering shafts 3b and 3a are joined together. A pressing portion 3c, protruding from the outer periphery of a lower end portion of the upper steering shaft 3a, preferably sticks out into this sensor storage portion 51.

The sensor storage portion 51 is preferably horizontally split into two portions by the pressing portion 3c. The magnetostrictive sensor element 21 is preferably stored in the right-hand-side portion, while the magnetostrictive sensor element 22 is preferably stored in the left-hand-side portion.

The magnetostrictive sensor element 21 preferably has its bottom pressed by a spring 53A, which is provided between the bottom of the sensor element 21 and one of the sidewalls of the sensor storage portion 51, toward the pressing portion 3c. As a result, a pressed portion 55A, which protrudes from the opposite side of the magnetostrictive sensor element 21 (as opposed to the bottom), contacts with, and is pressed by, the pressing portion 3c.

Likewise, the magnetostrictive sensor element 22 also preferably has its bottom pressed by a spring 53B, which is provided between the bottom of the sensor element 22 and the other sidewall of the sensor storage portion 51, toward the pressing portion 3c. As a result, another pressed portion 55B, which protrudes from the opposite side of the magnetostrictive sensor element 22 (as opposed to the bottom), contacts with, and is pressed by, the pressing portion 3c.

Each of the magnetostrictive sensor elements 21 and 22 preferably includes a magnetic coil, which senses a magnetic variation by utilizing an inverse magnetostriction effect and which defines a magnetostrictive sensor along with its associated pressed portion 55A or 55B. Specifically, when the pressed portion 55A or 55B is pressed and strained by the pressing portion 3c, some magnetic variation (e.g., variation in permeability or magnetizing property) is produced in the pressed portion 55A or 55B and can be sensed as a variation in the impedance of the magnetic coil of the magnetostrictive sensor element 21 or 22.

In detecting the torque of the steering shaft by using this load sensor unit 5, if the handlebars are turned to the left, for example, then the upper steering shaft 3a coupled to the handlebars rotates in the direction pointed by the arrow 301. As the upper steering shaft 3a rotates in such a direction, the pressing portion 3c thereof also rotates along with the upper steering shaft 3a in the direction of the arrow 302. And by utilizing the rotational force of this upper steering shaft 3a, the pressed portion 55A and the magnetostrictive sensor element 21 are driven in the direction of the arrow 303 against the spring 53A.

When pressed by the pressing portion 3c as the upper steering shaft 3a rotates, the pressed portion 55A is strained with the rotational force of the upper steering shaft 3a. As a result, a magnetic variation is produced in the pressed portion 55A so as to represent that strain. Eventually, this magnetic variation is sensed as the rotation torque of the upper steering shaft 3a by the magnetic coil of the magnetostrictive sensor element 21.

On the other hand, when the handlebars are turned to the right (i.e., in the opposite direction), the magnetostrictive sensor element 22, pressed portion 55B and spring 53B perform substantially the same functions as their counterparts 21, 55A and 53A except that their rotational and pressing directions are opposite. Thus, the description thereof will be omitted herein.

Suppose a certain load of F newtons (N) was applied in advance to the spring 53A while this load sensor unit 50 was assembled. In that case, unless the load applied by the pressing portion 3c on the pressed portion 55A and magnetostrictive sensor element 21 exceeds F newtons, the pressed portion 55A and the magnetostrictive sensor element 21 do not move. However, once the load has exceeded F newtons, the pressed portion 55A and the magnetostrictive sensor element 21 start moving to the right. Thus, an overload preventing mechanism, in which a load exceeding F newtons is never applied to the pressed portion 55A and the magnetostrictive sensor element 21, is realized.

The method of applying a load to the magnetostrictive sensor elements of a load sensing device does not have to be that described above but may also be any of various other methods. However, in a preferred embodiment of the present invention, a load is applied to only one of the two magnetostrictive sensor elements and the other magnetostrictive element, to which no load is applied, is used as a reference for measurement. Thus, in the load sensing device of this preferred embodiment, the load to be measured needs to be placed on one of the two magnetostrictive sensor elements. This principle applies to every imaginable situation where a predetermined physical quantity is measured with a physical quantity sensing device according to any preferred embodiment of the present invention.

Figure 11:
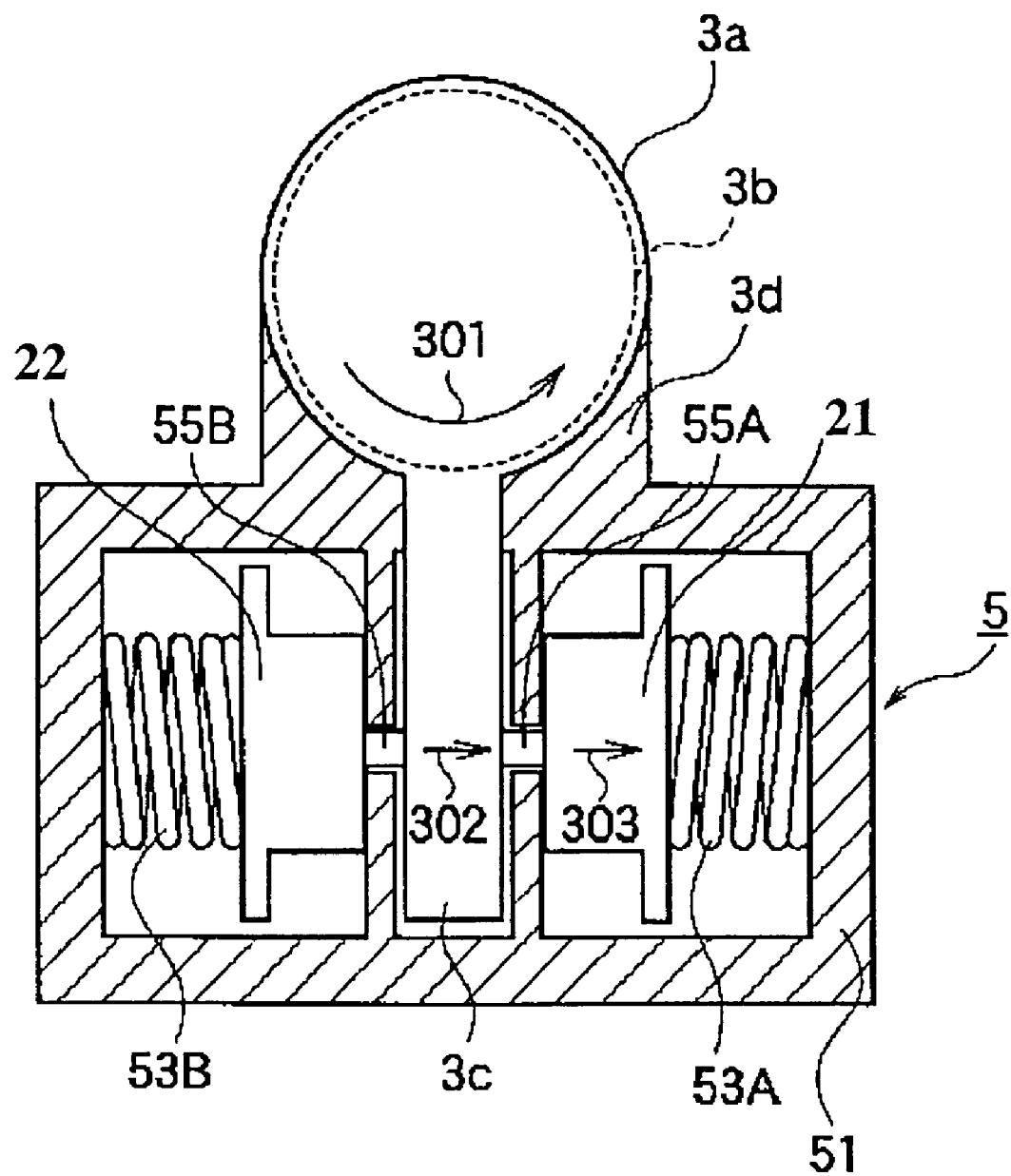
FIG. 11 is a cross-sectional view showing the configuration of the load sensor unit shown in FIG. 10.

FIGS. 10 and 11 do not illustrate any electronic circuit board on which amplifiers, resistors and other circuit components are integrated together. However, each of these electronic circuit boards may be either arranged in the vicinity of its associated magnetostrictive sensor element or combined with another control circuit section away from the magnetostrictive sensor element.

Load Sensing Operation

Hereinafter, it will be described more fully with reference to FIG. 2 how the load sensing device of this preferred embodiment performs its measuring operation.

First, the reference DC power supply 16 preferably outputs a reference DC voltage of about 2.5 V after receiving a supply voltage of about 5 V (not shown), for example. This reference DC voltage is preferably input to the sine wave oscillator 17. In response, the sine wave oscillator 17 preferably outputs a sine wave oscillation signal that oscillates with respect to this reference DC voltage. The sine wave oscillation signal may have a frequency of about 1 kHz and amplitude Vpp (peak to peak) of about 2 V, for example.

Then, this oscillation signal is preferably supplied to the bridge circuit section 20 by way of the high-impedance buffer amplifier 18 and current limiting fixed resistor 19.

When a load is placed on one of the magnetostrictive sensor elements 21 and 22, the initial permeability of the magnetostrictive material changes due to the magnetostriction effect in the magnetostrictive sensor element 21 or 22 that has just received the load. As a result, the impedance of that magnetostrictive sensor element 21 or 22 changes from its initial value and the impedance balance is disturbed between the first and second bridge arms.

Once the impedance balance has been lost in this manner, a differential voltage is generated between the first and second output points S1 and S2 of the bridge circuit section 20. Thereafter, this differential voltage is amplified by the AC differential amplifier 31 of the sensing circuit section 30. The AC components of the output signal of the AC differential amplifier 31 pass through the DC blocking capacitor 32 and then enter the full wave rectifier 33.

The full wave rectifier 33 includes rectifying diodes but cannot perform a rectifying operation at less than the forward voltage. That is to say, the rectifier 33 has a dead band. To avoid such an unwanted situation and make the full wave rectifier 33 perform an appropriate rectifying operation, the AC differential amplifier 31 preferably has as high a gain as possible. In this preferred embodiment, the gain of the AC differential amplifier 31 is preferably controlled to its maximum level such that the output of the AC differential amplifier 31 will not be saturated even if a load of absolute maximum rating is placed on one of the two magnetostrictive sensor elements 21 and 22.

Also, in this preferred embodiment, in order to increase the sensitivity of the full wave rectifier 33, the amplitude of the signal is doubled after the full wave rectification has been done. The amplified signal is then input to the low pass filter 34. To remove AC components with the same frequency as that of the exciting current (i.e., the oscillation frequency) sufficiently, the cutoff frequency of the low pass filter 34 is preferably about ⅒ or less of the oscillation frequency.

The output of the low pass filter 34 is preferably amplified by the DC amplifier 35 and then output through the signal voltage output terminal 36. The magnitude of the signal voltage at the signal voltage output terminal 36 preferably corresponds to that of the load that has been placed on one of the magnetostrictive sensor elements 21 and 22.

Initial Adjustment

To measure the load with high accuracy, an initial adjustment needs to be carried out. In this preferred embodiment, two types of initial adjustments are performed. One of the two types is a "zero point adjustment" in which the signal voltage output through the signal voltage output terminal 36 is set equal to zero with no load applied to the magnetostrictive sensor elements 21 and 22. The other type of initial adjustment is a "sensitivity adjustment" in which the signal voltage output through the signal voltage output terminal 36 is set to a predetermined value with a load of absolute maximum rating applied to the one of the magnetostrictive sensor elements 21 and 22.

In this preferred embodiment, while the AC output of the AC differential amplifier 31 is measured, the balancing variable resistors 23 and 26 are preferably adjusted so as to minimize the amplitude value of this AC output (which is the "zero point adjustment"). Next, with the DC output of the DC amplifier 35 measured, a load of about 400 N (newtons), for example, is preferably applied to one of the magnetostrictive sensor elements 21 and 22. The gain of the DC amplifier 35 is preferably controlled so as to set the output DC voltage of the DC amplifier 35 equal to about 3.5 V, for example, while this load is being applied (which is the "sensitivity adjustment").

In this preferred embodiment, the serial bridge circuit is adopted instead of the conventional parallel bridge circuit. Thus, the amount of current flowing through the first and second bridge arms, including the magnetostrictive sensor elements 21 and 22, can be greater than that of current flowing through the third and fourth bridge arms. Accordingly, even if the two magnetostrictive sensor elements 21 and 22 have somewhat varied initial characteristics due to a difference in initial permeability, for example, a sufficiently large amount of current can still flow through the magnetostrictive sensor elements 21 and 22 and the difference in output characteristic between the magnetostrictive sensor elements 21 and 22 would not decrease the sensing accuracy.

It should be noted that to increase the sensitivity of the AC differential amplifier 31, it is important to expand the differential amplitude range of the signal that is going to enter the AC differential amplifier 31. To maximize the amplitude of the differential output voltage at the load of absolute maximum rating, the impedance of the first bridge arm in the bridge circuit needs to be substantially equal to that of the second bridge arm. If the impedances are substantially matched between the first and second bridge arms, then the approximate center of the differential amplitude range can be brought close to the reference voltage. As a result, the gain of the AC differential amplifier 31 can be increased.

The magnetostrictive sensor elements 21 and 22 for use in this preferred embodiment preferably have substantially equal impedances. Thus, compared to the conventional example that uses the parallel bridge circuit, it is much easier to substantially match the impedances of the first and second bridge arms with each other. This is one of the advantages achieved by connecting the magnetostrictive sensor elements 21 and 22 in series together.

Also, if the impedance of the magnetostrictive sensor element 21 is substantially equal to that of the magnetostrictive sensor element 22, then the resistance variation range that the balancing variable resistor 23 needs to have can be much smaller than the impedances of the respective magnetostrictive sensor elements 21 and 22. This contributes to not only reducing the overall impedance of the first and second bridge arms but also minimizing the unwanted effects caused by the temperature characteristic of the balancing variable resistor 23. The resistance of the balancing variable resistor 23 usually has a relatively large degree of temperature dependence. For that reason, if the temperature of the balancing variable resistor 23 has varied after the zero point adjustment has been made, then the impedance balance is disturbed more easily. According to this preferred embodiment, however, the resistance value of the balancing variable resistor 23 can be sufficiently smaller than the impedances of the sensor elements. Consequently, the unwanted effects caused by the resistance-temperature characteristic of the balancing variable resistors can be minimized.

Balancing

Hereinafter, a balancing method according to this preferred embodiment will be described. As used herein, the "balancing" means to reduce the output differential voltage of the bridge circuit section 20 (i.e., the voltage between the output points S1 and S2) to zero while no load is being applied to either of the two magnetostrictive sensor elements 21 and 22 (which state will be referred to herein as a "no-load state").

First, one of the balancing variable resistors 23 and 26 is preferably adjusted in the no-load state, thereby minimizing the output amplitude of the AC differential amplifier 31. Next, the other balancing variable resistor 23 or 26 is preferably adjusted still in the no-load state, thereby minimizing the output amplitude of the AC differential amplifier 31 again. By alternately making such an adjustment on the two balancing variable resistors 23 and 26, the residual voltage can be reduced to zero completely (which is called "complete balancing"), theoretically speaking.

However, if the residual voltage has not quite reached zero due to incomplete zero point adjustment, then the output signal of one of the magnetostrictive sensor elements 21 and 22 that has received a load will have a temporarily decreased level. As a result, differences will be produced between the output characteristics of the two magnetostrictive sensor elements. According to this preferred embodiment, however, such a phenomenon can be eliminated.

Thus, the circuit configuration shown in FIG. 2 realizes complete balancing and can reduce the residual voltage to absolutely zero. The zero residual voltage means that the output voltage level under no load also reaches zero.

The present inventors confirmed via experiments how much the residual voltage was affected by the difference in the balancing circuit. As a result, the present inventors discovered that the residual voltage level varied significantly in the incomplete balancing circuit but that the measuring dynamic range could be expanded effectively according to the data collected for the complete balancing circuit.

As described above, the zero point stability has an important effect on the horizontal imbalance of the sensor and the sensing accuracy of a very small load. That is why the zero point should be stabilized as much as possible.

The lines, resistors, amplifiers, capacitors and other circuit components, which together form the circuit shown in FIG. 2, are preferably integrated together on a single electronic circuit board. The electronic circuit board is preferably encapsulated with a molding resin compound after having subjected to appropriate adjustments. If the surface of the electronic circuit board is covered with the resin in this manner, then the movable portions of the balancing variable resistors 23 and 26 will not move anymore. However, the contact 42 (see FIGS. 4A and 4B) of these balancing variable resistors 23 and 26 is not completely fixed. Accordingly, the contact portion between the resistive element 40 and the contact 42 shown in FIGS. 4A and 4B has an inconsistent resistance value (contact resistance value), which easily changes with time.

A conventional parallel bridge circuit with a variable resistor is designed such that current flows through its contact. In such a circuit, the variation in contact resistance value changes the value of the resistance between the terminals A and B shown in FIG. 4B, thus changing the equilibrium point of the bridge circuit.

In the bridge circuit section 20 of this preferred embodiment, however, the AC differential amplifier 31 preferably has such a high input impedance that almost no current flows through the contacts of the balancing variable resistors 23 and 26. Accordingly, even if the value of the contact resistance in the contacts of the balancing variable resistors 23 and 26 has varied with time or for any other reason, that variation does not affect the sensed voltage at all and the reliability of measurement can be increased.

In the serial bridge circuit for use in this preferred embodiment of the present invention, balancing can still be done even if a variable resistor is inserted into at least one (preferably both) of the bridge arms. In that case, however, current will flow through the contact of each variable resistor and the stability might decrease due to a variation in contact resistance. Even so, the decrease in zero point stability is still avoidable by using variable resistors with much more consistent contact resistance.

Preferred Embodiment 2

Hereinafter, a water vehicle including the load sensing device of the first specific preferred embodiment of the present invention will be described. In the following description, a watercraft will be described as a water vehicle according to a second specific preferred embodiment of the present invention. The watercraft is preferably propelled by jetting out water, which has been pressurized by an engine-driven jet propulsion machine, through a nozzle and by taking advantage of the reaction produced by the water jet. When used in such a vehicle, a physical quantity sensing device such as a load sensing device needs to guarantee sufficient durability and long-term reliability because the vehicle is supposed to be used on the water, which is a very severe environment for any electromechanical device to endure. In addition, the temperature may change significantly during the operation. Thus, by using the physical quantity sensing device of the above-described preferred embodiment of the present invention, many beneficial effects can be achieved.

Figure 12:
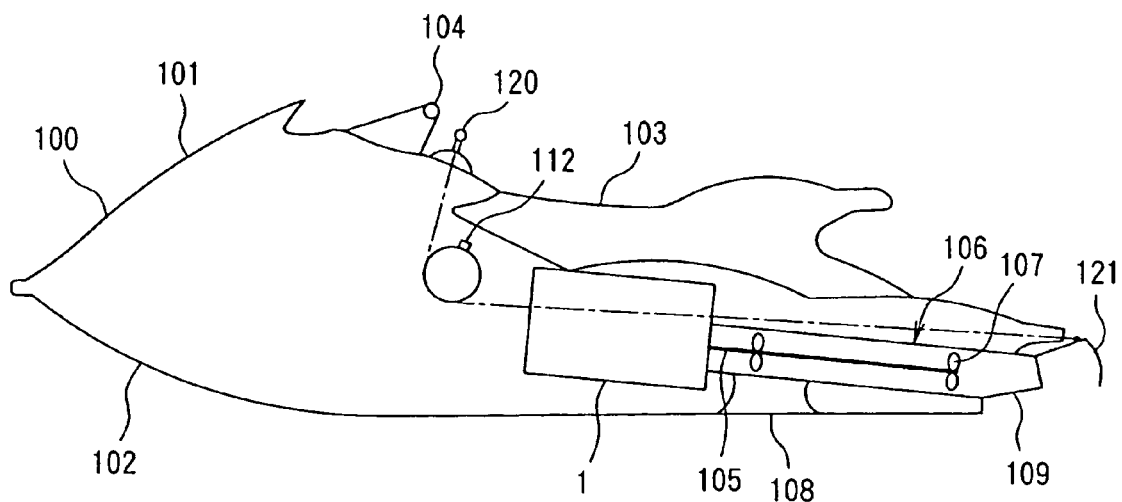
FIG. 12 schematically illustrates a configuration for a watercraft 100 as an exemplary vehicle including a physical quantity sensing device according to a preferred embodiment of the present invention.

FIG. 12 illustrates a schematic configuration for a watercraft 100 according to this preferred embodiment. The hull 100 of the watercraft preferably includes a lower hull member 101 and an upper deck member 102. An operator's seat 103 is preferably provided on the deck member 102. In front of this seat 103, steering handlebars 104 are provided.

In the hull, an engine 1 is preferably provided as a drive motor and the output shaft 105 of the engine 1 is connected to the impeller 107 of a jet propulsion machine 106. Accordingly, when the impeller 107 of the jet propulsion machine 106 is driven by the engine 1, water is sucked through a water sucking hole 108 on the bottom of the boat and then pressurized and accelerated by the jet propulsion machine 106. Then, the pressurized water is jetted backward through a nozzle 109, thereby advancing the boat due to its reaction. Also, if the handlebars 104 are turned, then a steering mechanism called a "deflector" swings behind the nozzle 109, thereby steering the boat either to the right or to the left. That is to say, by turning the handlebars 104, the direction of the water jet changes and the boat can be steered in an arbitrary direction. To reverse the boat, a reverse lever 120 is operated, thereby moving a reverse gate 121 up or down behind the nozzle 109 and jetting the water forward through the nozzle 109. A reverse switch 112 is used to sense the backward movement of the boat through the operation of the reverse lever 120.

Figure 13:
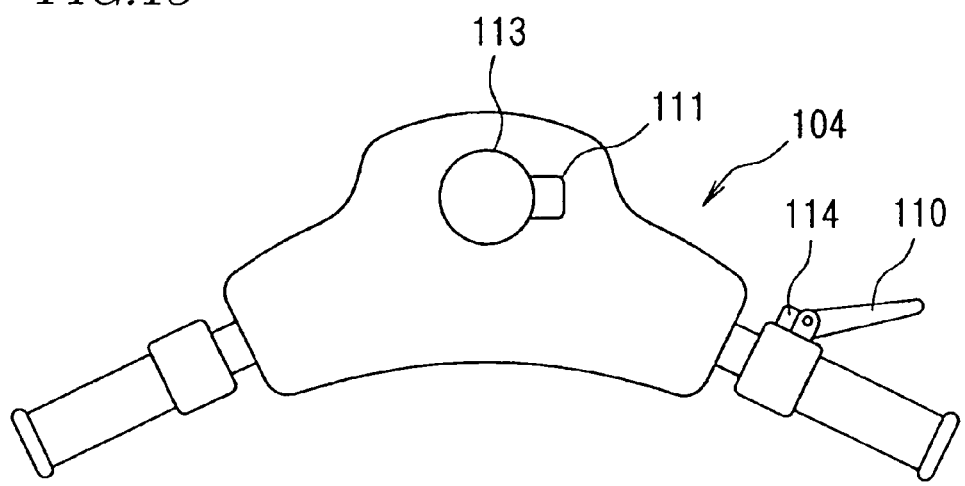
FIG. 13 illustrates the configuration of the handlebars 104 shown in FIG. 12.

FIG. 13 illustrates a configuration for the handlebars 104. The handlebars 104 can be turned either to the right or to the left around the steering shaft 113. A throttle lever 110 to be operated by the operator to accelerate or decelerate the boat is preferably provided near the right grip of the handlebars 104. While not gripped, this throttle lever 110 is not in contact with the right grip. In accelerating this boat, the operator grips the throttle lever 110 toward the grip end. And when released, the throttle lever 110 returns to its rest position to decelerate the boat.

A steering torque sensor 111 for sensing the steering force (more specifically, steering torque) on the handlebars 104 is preferably provided on the steering shaft 113. This steering torque sensor 111 preferably has the same configuration as the magnetostrictive load sensing device of the first preferred embodiment described above. If the handlebars 104 are turned to a predetermined steering angle or more, the steering torque sensor 111 further functions as a load cell for sensing the steering torque on the handlebars 104. It should be noted that the configuration of the steering torque sensor 111 is not limited to the specific configuration of the load sensor unit shown in FIGS. 10 and 11. Rather, the magnetostrictive sensor elements may be arranged and mechanically connected in various other ways. The throttle lever 110 is provided with a throttle opening sensor 114 for sensing to what degree the throttle lever 110 has been pressed by the operator (i.e., the throttle opening).

Figure 14:
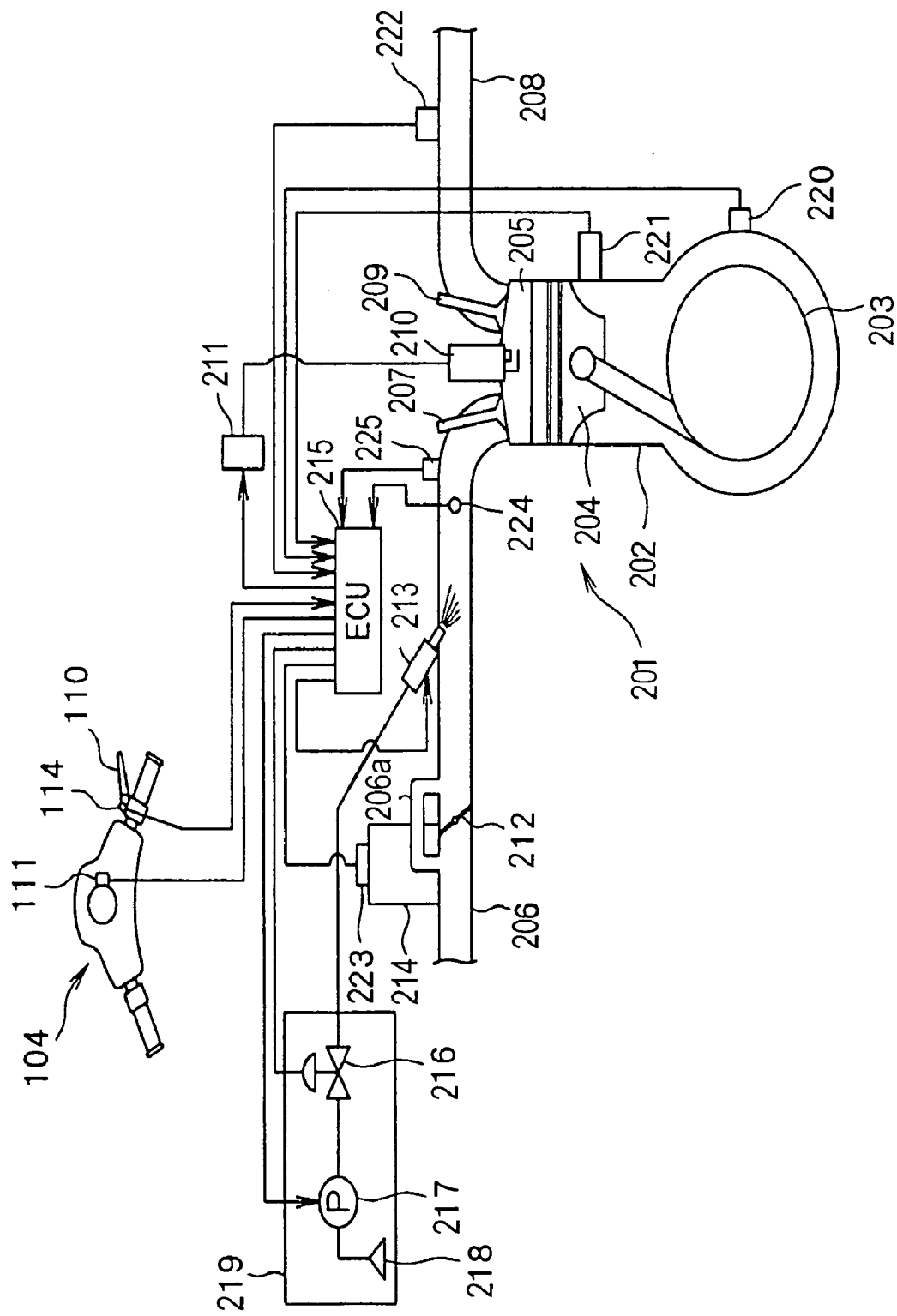
FIG. 14 schematically illustrates the engine and controller of the watercraft 100.

FIG. 14 schematically shows the engine and controller of the watercraft 100. The engine 201 of this preferred embodiment is preferably a stroke engine 201 with a relatively small displacement and preferably includes a cylinder body 202, a crank shaft 203, a piston 204, a combustion chamber 205, an intake pipe 206, an intake valve 207, an exhaust pipe 208, an exhaust valve 209, an ignition plug 210 and an ignition coil 211. Also, in the intake pipe 206, a throttle valve 212 is preferably arranged so as to open and close itself according to the opening of the throttle lever 110. And in a portion of the intake pipe 206, an injector 213 is preferably provided as a fuel injector downstream of the throttle valve 212. This injector 213 is preferably connected to a filter 218, a fuel pump 217 and a pressure control valve 216, which are provided in a fuel tank 219.

In the vicinity of the throttle valve 212 of the intake pipe 206, a bypass pipe 206a is preferably arranged so as to bypass the fuel beside the throttle valve 212. And this bypass pipe 206a is preferably provided with a bypass valve 214 for adjusting the opening of the bypass pipe 206a (as a means for controlling the engine output during deceleration). Just like an idle valve, the bypass valve 214 preferably adjusts the intake air flow toward the engine 201 independently of the opening of the throttle valve 212, thereby controlling the output of the engine (i.e., the engine torque in this case). It should be noted that the opening of the bypass pipe 206a (i.e., the engine torque) is controllable by adjusting the amount of current supplied to an actuator 223 for driving the bypass valve 214 or the duty ratio thereof as in an electromagnetic duty valve, for example.

The operation state of the engine 201 and the driving state of the actuator 223 for the bypass valve 214 are preferably controlled by an engine control unit 215, which preferably includes a computer such as a microcomputer. As control inputs to the engine control unit 215 (i.e., means for detecting the operation state of the engine 201), provided are a crank angle sensor 220 for detecting the angle of rotation (i.e., the phase) of the crank shaft 203 or the rotational velocity of the crank shaft 203 itself, a cooling water temperature sensor 221 for sensing either the temperature of the cylinder body 202 or that of the cooling water (i.e., the temperature of the engine body), an exhaust air-fuel ratio sensor 222 for sensing the air-fuel ratio in the exhaust pipe 208, an intake pressure sensor 224 for sensing the intake pressure in the intake pipe 206, and an intake temperature sensor 225 for sensing the temperature in the intake pipe 206 (i.e., the intake temperature).

The output signal of the steering torque sensor (i.e., the magnetostrictive load sensor) 111 provided for the steering handlebars 104 and the output signal of the throttle opening sensor 114 provided for the throttle lever 110 may be used to control the engine torque. The engine control unit 215 preferably receives the sensing signals of these sensors, thereby outputting control signals to the fuel pump 217, pressure control valve 216, injector 213, ignition coil 211 and actuator 223.

According to this preferred embodiment, the steering torque can be detected with a load sensing device, which can perform a temperature compensating function without having to provide any special temperature sensing elements or gain controllers and on which complete balancing has been done. That is why rather high measuring accuracy and improved reliability are achieved even in an environment of which the temperature changes in a broad range of about 0° C. to about 80° C., for example. In the preferred embodiment described above, the present invention is applied to a watercraft as an exemplary water vehicle. However, the present invention is in no way limited to that specific preferred embodiment.

In the preferred embodiments described above, magnetostrictive sensor elements are preferably used as exemplary sensor elements. However, the present invention is in no way limited to those specific preferred embodiments. Alternatively, sensor elements that sense a given load by utilizing a variation in electrostatic capacitance, a piezoelectric effect, or a variation in electrical resistance may also be used instead of the sensor elements that use the magnetic variation. Specifically, in such sensors utilizing a variation in electrostatic capacitance, the pressed portion is preferably an electrostatic capacitive electrode, and some means for sensing a variation in electrostatic capacitance preferably senses a variation in electrostatic capacitance as a variation at the pressed portion when the electrode is pressed with the rotational force of the steering shaft. On the other hand, in sensors utilizing a piezoelectric effect, the pressed portion is preferably a piezoelectric element, and some element or device for sensing a piezoelectric variation preferably senses an electrical variation of the piezoelectric element as a variation at the pressed portion when the piezoelectric element is pressed with the rotational force of the steering shaft. Furthermore, in sensors utilizing a variation in electrical resistance, the pressed portion is preferably a resistor and some element or device for sensing a resistance variation preferably senses an electrical resistance variation of the resistor as a variation at the pressed portion when the resistor is pressed with the rotational force of the steering shaft.

Nevertheless, the present invention achieves the most significant effects by using the magnetostrictive sensor elements among various other types of sensor elements. This is because when the magnetostrictive sensor elements are used, an output with a positive temperature coefficient can be obtained as described above. Thus, by combining such magnetostrictive sensor elements with an amplitude limiter with a negative temperature coefficient, the differential voltage of the bridge circuit can have reduced temperature dependence. That is why the present invention achieves significant effects when a given load needs to be measured accurately by using magnetostrictive sensor elements that have such a problem. The present invention also achieves similar effects even by using another type of sensor elements with a positive temperature coefficient like the magnetostrictive sensor elements.

A physical quantity sensing device according to any of various preferred embodiments of the present invention described above can be used effectively to sense the load that has been placed on any of numerous types of vehicles to be used either on the ground or on the water. Thus, this sensing device has a high degree of industrial applicability.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Application No. 2004-161673 filed on May 31, 2004, the entire contents of which are hereby incorporated by reference.

What is claimed is:

1. A physical quantity sensing device comprising:
an AC voltage generator arranged to generate an AC voltage; and
a bridge circuit that has first and second input points, to which the AC voltage is applied, and first and second output points, which are connected to a differential amplifier; wherein
the bridge circuit includes a first sensor element, an impedance of which changes with a physical quantity to be measured, and a second sensor element, an impedance of which also changes with the physical quantity to be measured, the first and second sensor elements having a positive temperature characteristic having a sensitivity that increases as temperature rises;
the AC voltage generator includes an oscillator and an amplitude limiter arranged to supply the AC voltage, an amplitude of which is limited within a predetermined range, in response to an output signal of the oscillator; and
the amplitude limiter has a negative temperature characteristic that decreases the amplitude of the AC voltage with a rise in temperature and the negative temperature characteristic of the amplitude limiter is substantially equal to the positive temperature characteristic of the first and second sensor elements of the bridge circuit, thereby compensating for temperature dependence of a differential voltage produced between the first and second output points.

2. The physical quantity sensing device of claim 1, wherein the oscillator is a sine wave oscillator having first and second operational amplifiers and in which the output of the first operational amplifier is supplied to an inverting input terminal of the second operational amplifier, and wherein the amplitude limiter includes:
   a terminal that receives an output signal of the second operational amplifier;
   resistors (R1) and R2), which are connected in series together so as to connect the terminal to a (Vcc) potential;
   resistors (R3) and (R4), which are connected in series together so as to connect the terminal to a ground potential;
   a forward diode (D1) and a resistor (R5), which are connected in series together so as to connect a connection point between the resistors (R1) and (R2) to the ground potential;
   a diode (D2), which connects a connection point between the diode (D1) and the resistor (R5) to the inverting input terminal of the second operational amplifier;
   a forward diode (D3) and a resistor (R6), which are connected in series together so as to connect a connection point between the resistors (R3) and (R4) to the (Vcc) potential; and
   a diode (D4), which connects a connection point between the diode (D3) and the resistor (R6) to the inverting input terminal of the second operational amplifier, and as the potential at the terminal increases or decreases, the diodes (D2) and (D4) are alternately turned ON, thereby limiting the amplitude of the potential at the terminal.

3. The physical quantity sensing device of claim 2, wherein the diodes (D1) and (D2) are the same type of diodes of which the cathodes are connected together, and the diodes (D3) and (D4) are the same type of diodes of which the anodes are connected together, and current is always flowing through the diodes (D1) and (D3) during their operation.

4. The physical quantity sensing device of claim 3, wherein resistance values of the resistors (R5) and (R6) are adjusted such that a variation in the amplitude of the differential voltage, generated between the first and second output points of the bridge circuit, with temperature becomes about 0.1%/° C. or less in the range of about 0° C. to about 80° C.

5. The physical quantity sensing device of claim 1, wherein the bridge circuit includes:
   a first bridge arm arranged to electrically connect the first input point to the first output point;
   a second bridge arm arranged to electrically connect the first output point to the second input point;
   a third bridge arm arranged to electrically connect the first input point to the second output point; and
   a fourth bridge arm arranged to electrically connect the second output point to the second input point; wherein the first bridge arm includes the first sensor element and the second bridge arm includes the second sensor element, and
   a total impedance of the first and second bridge arms is smaller than that of the third and fourth bridge arms.

6. The physical quantity sensing device of claim 1, wherein each of the first and second sensor elements is a magnetostrictive sensor element, an impedance of which changes according to a given load, and the physical quantity to be measured is a load that has been placed on one of the first and second sensor elements.

7. The physical quantity sensing device of claim 6, wherein the first sensor element is a first magnetostrictive sensor element including a first magnetostrictive member made of a magnetostrictive material and a first coil surrounding the first magnetostrictive member, the first coil electrically connecting the first input point and the first output point together, and the second sensor element is a second magnetostrictive sensor element including a second magnetostrictive member made of the magnetostrictive material and a second coil surrounding the second magnetostrictive member, and the second coil electrically connects the first output point and the second input point together.

8. The physical quantity sensing device of claim 5, wherein at least one of the first and second bridge arms includes a balancing variable resistor.

9. The physical quantity sensing device of claim 5, wherein the bridge circuit further includes a balancing variable resistor connected in series between the first and second sensor elements, and the first output point is connected to the balancing variable resistor.

10. The physical quantity sensing device of claim 9, wherein the bridge circuit further includes a second balancing variable resistor connected in series between the third and fourth bridge arms, and the second output point is connected to the second balancing variable resistor.

11. The physical quantity sensing device of claim 10, wherein while the sensing device is performing a measuring operation, substantially no current flows between the first output point and the differential amplifier and between the second output point and the differential amplifier.

12. The physical quantity sensing device of claim 1, wherein the AC voltage generator, the bridge circuit and the differential amplifier are integrated together on a common electronic circuit board.

13. A vehicle comprising:
   the physical quantity sensing device of claim 1; and
   an engine that is operatively coupled to the physical quantity sensing device such that an operation of the engine is controlled according to the physical quantity sensed by the physical quantity sensing device.

14. The vehicle of claim 13, wherein the physical quantity sensed by the physical quantity sensing device is a quantity depending on a force that has been applied by an operator on handlebars of the vehicle.

15. The vehicle of claim 13, wherein the vehicle is a jet propelled boat.

16. The vehicle of claim 13, wherein the physical quantity sensing device includes a steering torque sensor.

* * * * *